United States Patent [19]

Shuey et al.

[11] 4,453,089
[45] Jun. 5, 1984

[54] TRANSISTOR BASE DRIVE CIRCUIT

[75] Inventors: Kenneth C. Shuey, Cridersville; David L. Stechschulte, Columbus Grove, both of Ohio

[73] Assignee: Westinghouse Electric Corp., Pittsburgh, Pa.

[21] Appl. No.: 368,941

[22] Filed: Apr. 16, 1982

[51] Int. Cl.³ .................. H03K 17/60; H03K 3/33
[52] U.S. Cl. .................. 307/253; 307/270; 307/280; 307/300
[58] Field of Search ........... 307/270, 300, 280, 546, 307/549, 551, 253

[56] References Cited

U.S. PATENT DOCUMENTS

| | | | |
|---|---|---|---|
| B 530,285 | 4/1976 | Sakamoto et al. | 307/300 |
| 3,010,031 | 11/1961 | Baker | 307/237 |
| 3,160,765 | 12/1964 | Krossa | 307/300 |
| 3,463,975 | 8/1969 | Biard | 307/317 |
| 3,534,281 | 10/1970 | Hillhouse | 307/300 |
| 3,710,041 | 1/1973 | Hayashi | 307/300 |
| 3,858,059 | 12/1974 | Khana | 307/270 |
| 4,360,744 | 11/1982 | Taylor | 307/270 |

FOREIGN PATENT DOCUMENTS 215148  11/1957  Australia ............. 307/270

Primary Examiner—Stanley D. Miller
Assistant Examiner—B. P. Davis
Attorney, Agent, or Firm—R. P. Lenart

[57] ABSTRACT

A transistor base drive circuit achieves optimum base current levels to avoid unnecessary transistor power dissipation by including means for diverting excessive base drive from the transistor base to the transistor collector. A capacitor in series with the transistor base decreases switch transition time. Increasing capacitance of the capacitor results in a decrease in transistor saturation voltage, thereby decreasing power dissipation in the transistor.

6 Claims, 5 Drawing Figures

TRANSISTOR BASE DRIVE CIRCUIT

BACKGROUND AND SUMMARY OF THE INVENTION

This invention relates to semiconductor switching circuits and more particularly to such circuits utilized for power switching in direct current inverters.

In direct current inverter circuits, such as those found in DC link aircraft inverter power systems, power transistors are driven into saturation for switching output current to provide an alternating current power supply. For DC link inverter technology to be competitive with conventional aircraft power systems which utilize hydraulic constant speed drives coupled to synchronous AC generators to provide 400 Hz electrical power, the total power loss and circuit complexity must be held to a minimum while offering system performance equal to the conventional system.

This invention relates specifically to an improvement in transistor drive circuit technology which improves switching time of power transistors while limiting transistor power dissipation without significantly increasing circuit complexity.

DC link power inverters have used a transistor drive concept known as current-coupled feedback in which a transformer is used to deliver a portion of a switching transistor's collector current to the transistor base circuit. An inverter using this concept to control switching transistors is disclosed in U.S. Pat. No. 3,715,648 issued to Kernick et al. on Feb. 6, 1973. Using the current-coupled feedback technique, base current is always proportional to collector current, the current ratio being set by the transformer turns ratio. This turns ratio is determined from the minimum gain of the transistor which typically occurs at the peak collector current. Therefore, adequate base current is supplied at all loads without having to provide maximum base current at all times. Even though the maximum base current is not delivered at all loads, a base current in excess of the transistor requirements at nearly all loads is normally applied. This occurs because the transistor current gain is typically much higher at reduced current levels than at the maximum rated current.

To avoid problems associated with excessive base current drive, various circuits have been utilized to divert excessive base current. Several of these circuits are described in U.S. Pat. No. 4,246,501 issued to Baker on Jan. 20, 1981. Such circuits generally result in an increase in saturation voltage level of the transistor in order to achieve the desired current diversion. This increased saturation voltage leads to undesirable increases in transistor power dissipation.

A transistor switching circuit constructed in accordance with the present invention utilizes a branch circuit which includes the series connection of a first and second diode. This branch circuit is connected to the base of a switching transistor; a third diode is connected between the junction of said first and second diodes and the collector of the switching transistor; and a capacitor is connected in parallel with the branch circuit. This circuit arrangement provides for diversion of excess transistor base current from the base circuit to the transistor collector, while minimizing any increase in transistor saturation voltage.

DESCRIPTION OF THE PREFERRED EMBODIMENT

Figure 1:
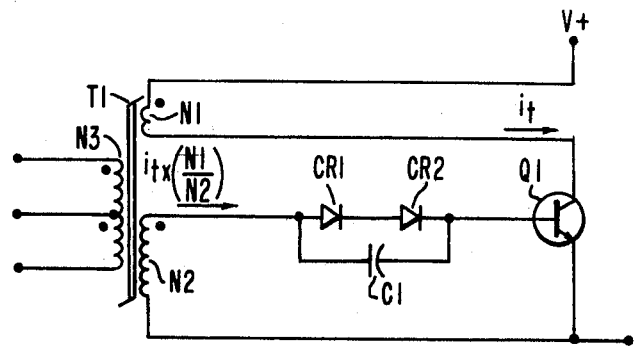
FIG. 1 is a prior art transistor switching circuit illustrating the current-coupled feedback transistor base drive technique.

The present invention transistor switching circuit can be most clearly described by initially referring to the prior art controlled current feedback switching circuit of FIG. 1. In this circuit, terminal V+ is connected to a direct current power source. A brief current pulse through control winding N3 on transformer T1 can be used to induce a voltage on winding N2 sufficient to cause switching transistor Q1 to begin conducting. The collector current $i_t$ of switching transistor Q1 passes through transformer winding N1. This induces a current in transformer winding N2 which has a value proportional to the ratio of the number of turns in winding N1 to the number of turns in winding N2 times the collector current $i_t$. The winding ratio has been selected to be equal to the minimum rated transistor current gain. If capacitor C1 is initially discharged, base current begins by flowing through capacitor C1 until the voltage on capacitor C1 is equal to the sum of the forward bias voltages of diodes CR1 and CR2. When transformer T1 saturates, the induced voltage in winding N2 goes to zero and the voltage on capacitor C1 acts to reverse bias the base emitter junction of switching transistor Q1 thereby improving the transistor turn-off characteristic.

Figure 2:
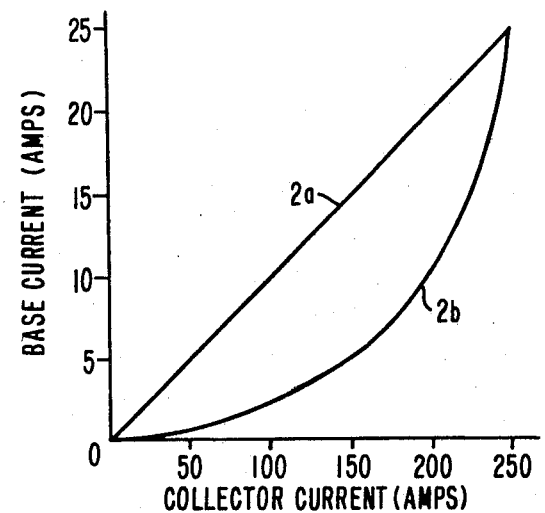
FIG. 2 is a curve of transistor base current and transistor collector current illustrating the difference between the base current delivered by the circuit of FIG. 1 and the optimal base current.

Referring to FIG. 2, curve 2a represents the base current for a given collector current in switching transistor Q1 of the circuit of FIG. 1 for a typical 250 amp transistor having a minimum rated current gain of 10. Curve 2b of FIG. 2 indicates the optimum base current versus collector current based on the transistor gain characteristic. The difference between the two curves is excessive base current. For DC link inverters, excessive base current adds to the transistor's switching time and ultimately can cause poor output power quality for the power system.

Figure 3:
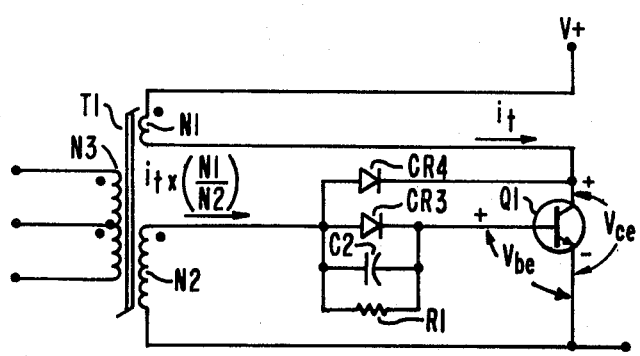
FIG. 3 is a prior art transistor switching circuit utilizing a diode current diversion technique.

To avoid the problems associated with excessive base drive currents, a clamping circuit sometimes referred to as a Baker clamp has been utilized in the base drive circuitry as shown in FIG. 3. In this prior art circuit, diodes CR3 and CR4 combine to force an increase in the saturation voltage of switching transistor Q1 until the transistor saturation voltage is equal to the transistor base-to-emitter voltage such that:

$$V_{CR3} + V_{be} = V_{CR4} + V_{sat} \tag{1}$$

Where $V_{CR3}$ and $V_{CR4}$ are the voltages across diodes CR3 and CR4 respectively and $V_{be}$ is the base-to-emitter voltage. With the saturation voltage raised to this level, the base current is optimized and excessive base current is by-passed through diode CR4 and the transistor's collector-to-emitter voltage drop.

The main disadvantage of this circuit is the increased collector-to-emitter power dissipation associated with the required increase in saturation voltage. An extension of the circuit of FIG. 3 has been utilized in which a small resistor is inserted in series with diode CR4. This resistor tends to reduce the circuit's effect at high levels of base current, but is quite nonlinear with gain and temperature requirements of the transistor. The prior art circuitry of FIG. 3 has also incorporated a resistor R1 of low value, in parallel with capacitor C2, thereby eliminating the operating principle presented for the present invention.

Figure 4:
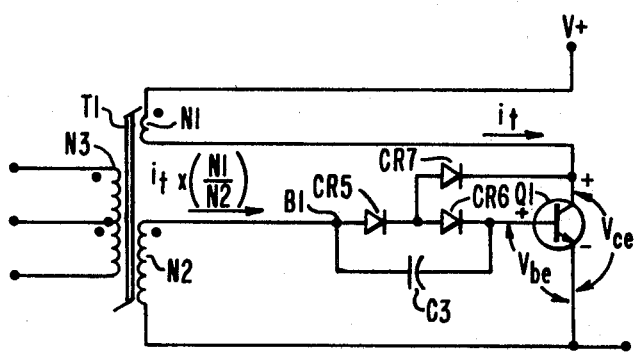
FIG. 4 is a transistor switching circuit constructed in accordance with one embodiment of the present invention.

FIG. 4 is a schematic diagram of a transistor switching circuit constructed in accordance with one embodiment of the present invention. Terminal V+ is used to connect the switching circuit to an external direct current power source. Transformer T1 serves as means for supplying base current to switching transistor Q1 and includes three windings N1, N2 and N3 wherein the ratio of the number of turns in winding N1 to the number of turns in winding N2 is selected to be equivalent to the minimum-rated current gain of switching transistor Q1. Winding N3 is a control winding which initiates turn-on and accomplishes turn-off of transistor Q1. Since transformer winding N1 is connected in series between terminal V+ and the collector of switching transistor Q1, collector current $i_t$ flowing through switching transistor Q1 will induce a current in transformer winding N2 having a value equivalent to current $i_t$ times the ratio of the number of turns in winding N1 to the number of turns in winding N2. This represents the maximum available base current and is supplied to terminal B1. A branch circuit comprising the series connection of diodes CR5 and CR6 connects the base of switching transistor Q1 to terminal B1. A third diode CR7, is connected between the collector of transistor Q1 and the junction point of diodes CR5 and CR6. Capacitor C3 is connected in parallel with the branch circuit comprising the series connection of diodes CR5 and CR6.

The circuit of FIG. 4 utilizes diode CR7 to divert excessive base current out of the base of switching transistor Q1, similar to the circuit of FIG. 3, with the important operational difference that the collector-to-emitter voltage of switching transistor Q1 is not required to be equivalent to the base-to-emitter voltage for optimized base current to exist. Rather, the optimum base current is achieved when the rate of rise of collector-to-emitter voltage is sufficient to cause optimum base current through capacitor C3. By making the value of capacitor C3 quite large, the change in saturation voltage may be minimized and as a result, the undesired increase in power dissipation of the switching transistor in the circuit of FIG. 3 can be minimized.

In the circuit of FIG. 4, collector current $i_t$ present in winding N1 is transformed into winding N2 so that a current equal to $i_t \times (N1/N2)$ is the output from winding N2 of transformer T1. This current will be the transistor base current if no current flows through diode CR7, which will happen when the transistor's gain is less than or equal to the ratio of the number of turns in winding N2 to the number of turns in winding N1. For this operating mode, the capacitor voltage is constant and equal to the forward drop across diodes CR5 and CR6. For operating modes where the transistor current gain is greater than (N2/N1), excessive base drive exists and is diverted through diode CR7 and the collector-to-emitter voltage $V_{sat}$. As an illustration of the operation of the circuit of FIG. 4, assume that initially transistor Q1 is fully saturated at a low value of $V_{sat}$. If the voltage across capacitor C3 is very low, all of the current $i_t \times (N1/N2)$ will flow through capacitor C3 into the base of transistor Q1. This current will begin to charge capacitor C3 positively until:

$$V_C + V_{be} = V_{CR5} + V_{CR7} + V_{sat} \tag{2}$$

where the $V_C$ is the capacitor voltage and $V_{CR5}$ and $V_{CR7}$ are the voltage drops across diodes CR5 and CR7, respectively. When the capacitor voltage $V_C$ has increased sufficiently to reach a generally fixed preselected voltage and thereby satisfy equation (2), a portion of the current available from winding N2 will be diverted through $V_{CR5}$, $V_{CR7}$ and $V_{sat}$.

This diverted excessive base current will tend to increase transistor saturation voltage, but capacitor C3 now responds in a closed loop fashion to this increase in $V_{sat}$. When the voltages are summed around the loop, the delivered optimum base current is found to be:

$$i_b = \frac{i_t}{h_{fe}} = \frac{C \Delta V_{sat}}{\Delta t} \tag{3}$$

where $i_b$ is base current, $i_t$ is the collector current, and $h_{fe}$ is the transistor current gain. From equation (3), it is apparent that the change in saturation voltage can be minimized by increasing the value of capacitor C3 or increasing transistor current gain $h_{fe}$ because:

$$\Delta V_{sat} = \frac{i_t}{h_{fe} C} \Delta t. \tag{4}$$

Therefore, the value of capacitance can be directly traded off against transistor power dissipation which will result from larger changes in transistor saturation voltage levels, and can be tailored for any duty cycle to ensure that switching occurs when the transistor is on the edge of saturation.

Figure 5:
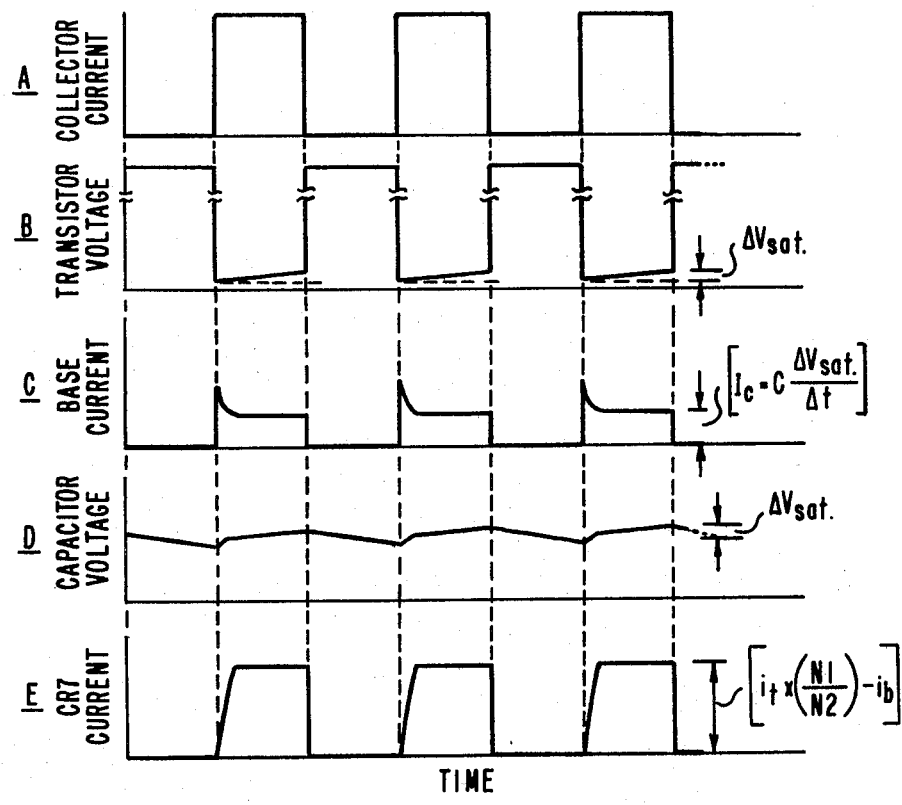
FIG. 5 is a series of waveforms illustrating the operation of the switching circuit of FIG. 4.

Example currents and voltages for a switched waveform input are shown in FIG. 5. Capacitor voltage is not allowed to discharge sufficiently in the off time and consequently operates in the closed loop mode for nearly all of each switch period. The majority of transformed current is diverted away from the base, which is characteristic of normal operation when the transistor current gain is considerably above that minimum level which is used to set the control current feedback transformer ratio. When the transistor is required to shut off, the reduced base current enhances the shut-off time as previously described for the circuit of FIG. 3.

Waveforms A and B of FIG. 5 illustrate idealized switching patterns of the power transistor Q1 in FIG. 4. Waveform B shows the change in saturation voltage $\Delta V_{sat}$ which occurs as a result of base current diversion through diode CR7, thus allowing transistor Q1 to operate on the edge of saturation and minimizing storage time due to excess base carriers.

Waveform C of FIG. 5 illustrates base current $I_B$ for a fixed collector current $I_C$. The capacitor voltage of waveform D of FIG. 5 increases during transistor on time as charge is stored, thereby controlling $\Delta V_{sat}$. Waveform E of FIG. 5 represents the current diverted through diode CR7. Current through diode CR7 will initially be at a low level with all of the available base current being forced through the base path to provide an amplified turn-on characteristic.

By way of further example, the following component specifications may be used in conjunction with the circuit of FIG. 4 to construct one embodiment of the present invention.

TABLE 1

| | |
|---|---|
| N1 | 2 Turns |
| N2 | 18 Turns |
| N3 | 144 Turns |
| CR5, CR6 | 1N1184 |
| CR7 | Motorola MR876 |
| Q1 | Melco FH200B-5015 |
| C3 | 1024 mfd, 10 V |
| Vt | 270-300 volts |

A transistor base drive circuit constructed in accordance with this invention provides for optimized base current without significant increase in saturation voltage. In addition, transistor switching time is minimized without a significant increase in saturation voltage. These results are achieved with a minimum of additional circuitry added to prior art circuits.

What is claimed is:

1. A semiconductor switching circuit comprising:
   a transistor having a base, an emitter, and a collector;
   means for supplying a base drive current to said transistor;
   a circuit branch including the series connection of a first diode and a second diode, said circuit branch being connected between said means for supplying base drive current and said transistor base;
   a capacitor connected in parallel with said circuit branch; and
   a third diode connected between the connecting point between said first and second diodes and said transistor collector.

2. A semiconductor switching circuit as recited in claim 1, wherein said means for supplying a base drive current comprises:
   a transformer having a first winding and a secnd winding;
   said first winding being connected between a voltage source and said transistor collector; and
   said second winding being connected between one end of said circuit branch and said transistor emitter.

3. A semiconductor switching circuit as recited in claim 2, wherein the ratio of the number of turns in said first winding to the number of turns in said second winding is equal to the gain of said transistor at maximum collector current.

4. A semiconductor switching circuit comprising:
   a transistor having a base, an emitter, and a collector;
   a transformer having a first winding and a second winding, said first winding being connected between a voltage source and said transistor collector, and said second winding being connected between said transistor base and said transistor emitter, wherein current flowing in said second winding is proportional to current flowing in said first winding;
   a circuit branch connected in series between said second winding and said transistor base, said circuit branch including the series connection of a first diode and a second diode; and
   means for diverting current from the connection between said first and second diodes to said transistor collector when the voltage across said second winding exceeds the sum of a preselected generally fixed voltage level plus the collector to emitter voltage of said transistor.

5. A semiconductor switching circuit as recited in claim 4, further comprising:
   a capacitor connected in parallel with said branch circuit.

6. A semiconductor switching circuit as recited in claim 5, wherein said means for diverting base current is a third diode connected between the connection between said first and second diodes and said transistor collector.

* * * * *